United States Patent
Uchida et al.

(10) Patent No.: US 10,470,301 B2
(45) Date of Patent: Nov. 5, 2019

(54) METHOD FOR MANUFACTURING CONDUCTIVE PATTERN AND CONDUCTIVE PATTERN FORMED SUBSTRATE

(71) Applicant: SHOWA DENKO K.K., Tokyo (JP)

(72) Inventors: Hiroshi Uchida, Tokyo (JP); Kenji Shinozaki, Tokyo (JP); Eri Okazaki, Tokyo (JP); Hideki Ohata, Tokyo (JP); Yasunao Miyamura, Tokyo (JP)

(73) Assignee: SHOWA DENKO K.K., Minato-ku, Tokyo (JP)

( * ) Notice: Subject to any disclaimer, the term of this patent is extended or adjusted under 35 U.S.C. 154(b) by 0 days.

(21) Appl. No.: 14/786,812

(22) PCT Filed: Apr. 17, 2014

(86) PCT No.: PCT/JP2014/060928
§ 371 (c)(1),
(2) Date: Oct. 23, 2015

(87) PCT Pub. No.: WO2014/175163
PCT Pub. Date: Oct. 30, 2014

(65) Prior Publication Data
US 2016/0073494 A1    Mar. 10, 2016

(30) Foreign Application Priority Data

Apr. 26, 2013  (JP) .................. 2013-093882

(51) Int. Cl.
*H05K 1/09* (2006.01)
*H05K 3/12* (2006.01)
(Continued)

(52) U.S. Cl.
CPC .......... *H05K 1/0274* (2013.01); *G06F 3/041* (2013.01); *H01L 51/0021* (2013.01);
(Continued)

(58) Field of Classification Search
CPC ................. H01L 51/0021; G06F 3/041; G06F 2203/04103; H05K 3/1283; H05K 3/1216;
(Continued)

(56) References Cited

U.S. PATENT DOCUMENTS 8,053,143 B2 * 11/2011 Alexandrovichserov .................... B01J 23/62
429/492
9,396,843 B2 * 7/2016 Chung ...................... H01B 1/02
(Continued)

FOREIGN PATENT DOCUMENTS

CN    101443483 A    5/2009
CN    101801674 A    8/2010
(Continued)

OTHER PUBLICATIONS

The First Office Action dated May 24, 2016, issued by the State Intellectual Property Office of the P.R.C. in corresponding Chinese Application No. 201480023443.0.
(Continued)

*Primary Examiner* — William Lu
(74) *Attorney, Agent, or Firm* — Sughrue Mion, PLLC

(57) ABSTRACT

Provided are a conductive pattern manufacturing method and a conductive pattern formed substrate, capable of easily achieving a narrow pitch. A metal nanowire layer 12 is formed on the entirety of a part of at least one of the main faces of a substrate 10, pulsed light is irradiated thereto through a mask 14 provided with a light transmission portion 14a formed in a predetermined pattern, and the metal nanowires in the metal nanowire layer 12 at the region having the above predetermined pattern were sintered, to thereby obtain conductivity at the predetermined patterned region. Accordingly, a substrate provided with a conductive
(Continued)

pattern having any selected pattern can be produced by simple steps.

28 Claims, 3 Drawing Sheets

(51) Int. Cl.
  *H05K 1/02*  (2006.01)
  *H01L 51/00*  (2006.01)
  *G06F 3/041*  (2006.01)
  *H05K 3/10*  (2006.01)

(52) U.S. Cl.
  CPC .............. *H05K 1/097* (2013.01); *H05K 3/105* (2013.01); *H05K 3/1216* (2013.01); *H05K 3/1283* (2013.01); *G06F 2203/04103* (2013.01); *H05K 2201/0108* (2013.01)

(58) Field of Classification Search
  CPC ...... H05K 3/105; H05K 1/097; H05K 1/0274; H05K 2201/0108
  See application file for complete search history.

(56) References Cited

U.S. PATENT DOCUMENTS

| | | | | |
|---|---|---|---|---|
| 2004/0102050 | A1* | 5/2004 | Delamarche | B81C 1/0046 438/734 |
| 2007/0074316 | A1* | 3/2007 | Alden | B82Y 20/00 257/784 |
| 2008/0020304 | A1 | 1/2008 | Schroder et al. | |
| 2009/0098479 | A1* | 4/2009 | Sykes | G03F 7/70041 430/270.1 |
| 2009/0189124 | A1* | 7/2009 | Guiheen | H01B 1/124 252/500 |
| 2010/0002282 | A1* | 1/2010 | Agrawal | H01B 1/026 359/275 |
| 2010/0078602 | A1* | 4/2010 | Hosoya | H01B 1/22 252/514 |
| 2011/0285019 | A1* | 11/2011 | Alden | B82Y 30/00 257/741 |
| 2011/0287347 | A1* | 11/2011 | Sakai | G03F 1/82 430/5 |
| 2011/0297642 | A1* | 12/2011 | Allemand | B82Y 10/00 216/13 |
| 2012/0085145 | A1* | 4/2012 | Xiao | B82Y 30/00 73/23.2 |
| 2012/0104335 | A1* | 5/2012 | Etori | B82Y 10/00 252/519.21 |
| 2012/0107600 | A1 | 5/2012 | Zou | |
| 2013/0078436 | A1* | 3/2013 | Naito | H05B 33/28 428/196 |
| 2013/0087363 | A1* | 4/2013 | Oh | H01L 31/022466 174/126.1 |
| 2013/0133934 | A1* | 5/2013 | Flores | C09D 5/38 174/257 |
| 2013/0140649 | A1* | 6/2013 | Rogers | H01L 29/66 257/414 |
| 2014/0027954 | A1* | 1/2014 | Claracq | H05K 7/00 264/433 |
| 2014/0065300 | A1* | 3/2014 | Khanarian | H01B 13/00 427/125 |
| 2014/0131078 | A1* | 5/2014 | Joo | G06F 3/041 174/257 |
| 2014/0175707 | A1* | 6/2014 | Wolk | B29C 35/0894 264/447 |
| 2014/0209469 | A1* | 7/2014 | Scott | C25D 1/04 205/76 |
| 2014/0323968 | A1* | 10/2014 | Rogers | H05K 13/0023 604/113 |
| 2015/0056382 | A1* | 2/2015 | Suganuma | H01B 1/22 427/553 |
| 2015/0185890 | A1* | 7/2015 | Kaneko | G06F 3/044 428/457 |

FOREIGN PATENT DOCUMENTS

| | | |
|---|---|---|
| CN | 102250506 A | 11/2011 |
| CN | 102311681 A | 1/2012 |
| CN | 102481758 A | 5/2012 |
| CN | 102527621 A | 7/2012 |
| CN | 103730206 A | 4/2014 |
| JP | 2003-327725 A | 11/2003 |
| JP | 2008-522369 A | 6/2006 |
| JP | 2009-505358 A | 2/2009 |
| WO | 2006/071419 A2 | 7/2006 |
| WO | 2007/022226 A2 | 2/2007 |
| WO | 2008/144504 A1 | 11/2008 |

OTHER PUBLICATIONS

Shih-Hsiang Lai et al., "P-9: Metallic Nanowires Film as Transparent Conducting Layer in TFT-LCDs," SID Symposium Digest of Technical Papers, 2008, pp. 1200-1202, vol. 39, No. 1.
International Search Report of PCT/JP2014/060928 dated Jul. 22, 2014.
The Second Office Action dated Dec. 26, 2016, issued by the State Intellectual Property Office of the P.R.C. in corresponding Chinese Application No. 201480023443.0.
Communication dated Dec. 5, 2017 from the Japanese Patent Office in counterpart Application No. 2015-513719.
Communication dated Nov. 2, 2016, from the European Patent Office in counterpart European application No. 14789046.1.
Communication dated Jan. 2, 2018, from State Intellectual Property Office of the P.R.C. in counterpart application No. 201480023443.0.

* cited by examiner

[FIG. 1]
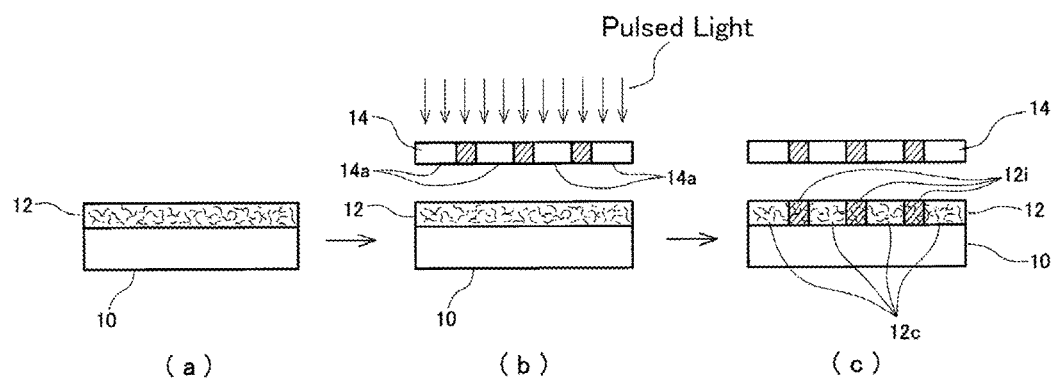
[FIG. 2]
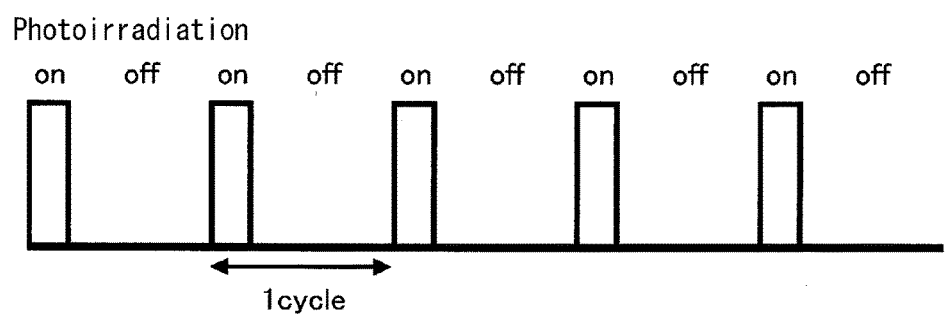

[FIG. 3]
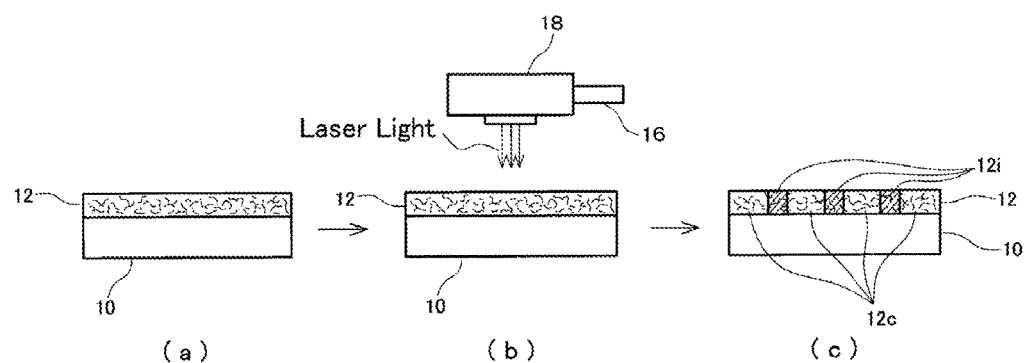
[FIG. 4]
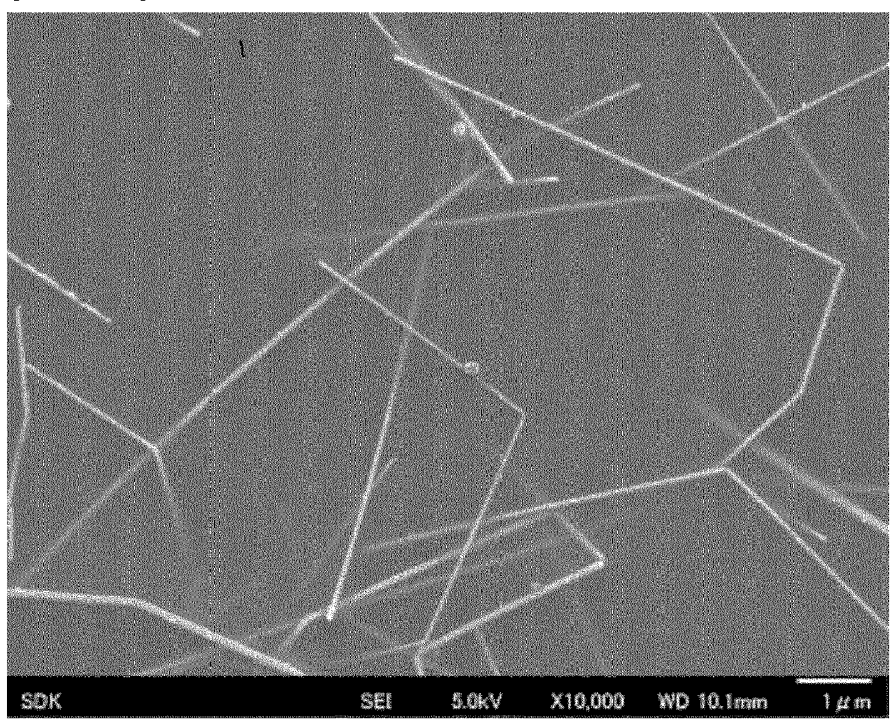

[FIG. 5]
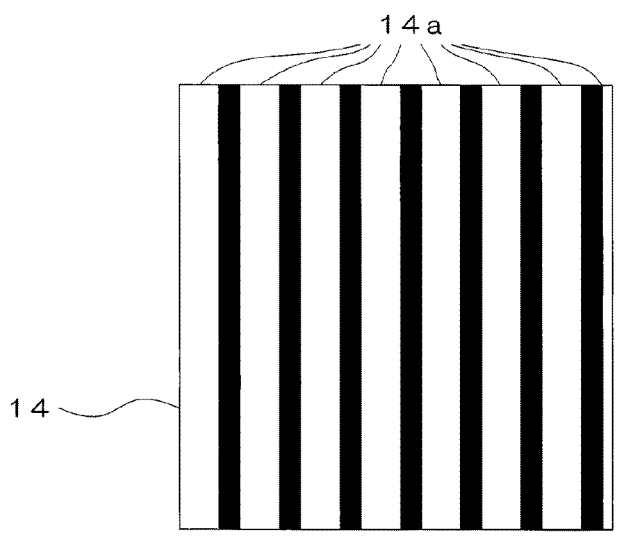
[FIG. 6]
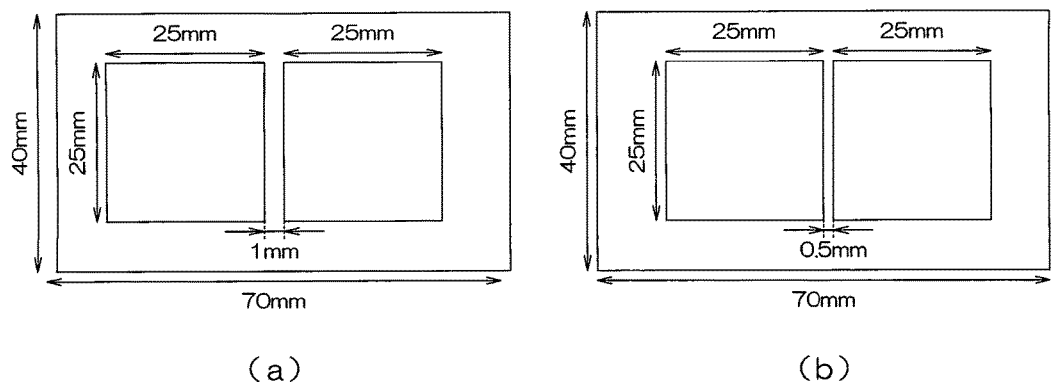
(a)                      (b)

METHOD FOR MANUFACTURING CONDUCTIVE PATTERN AND CONDUCTIVE PATTERN FORMED SUBSTRATE

CROSS REFERENCE TO RELATED APPLICATIONS

This is a National Stage of International Application No. PCT/JP2014/060928 filed Apr. 17, 2014, claiming priority based on Japanese Patent Application No. 2013-093882 filed Apr. 26, 2013, the contents of all of which are incorporated herein by reference in their entirety.

TECHNICAL FIELD

The present disclosure relates to a method for manufacturing a conductive pattern, and a conductive pattern formed substrate.

BACKGROUND ART

Recently, various electronic devices such as a mobile phone, a mobile terminal, a personal computer, or the like, are provided with a display panel on which an optically transparent touch panel is attached. Such an electronic device can receive an instruction operation when a user operates on the surface of the touch panel with his/her finger, etc., while the user visually recognizes the display on the display panel through the touch panel.

As for such a touch panel, for example, an electrostatic capacitance touch panel is known, which has a transparent substrate on which a predetermined shaped transparent electrode pattern is formed in the X-direction, and similar transparent electrode pattern is formed in the Y-direction (the direction perpendicular to the X-direction).

A transparent electrode pattern used for the above-mentioned touch panel may have a problem which is usually referred to as "pattern visibility", i.e., the electrode pattern is visible, due to the difference in optical property between a region where an electrode pattern is formed (conductive region) and a region where no electrode pattern is formed (non-conductive region). In order to prevent the "pattern visibility", the gap between the boundaries of the transparent electrode patterns must be made extremely narrow. For example, in case of a electrostatic capacitance touch panel, the gap between the X-direction electrode pattern and the Y-direction electrode pattern must be 50 µm at the maximum, preferably 20 µm or less, more preferably 10 µm or less. Realizing such a narrow pitch is difficult by printing, and thus, such a pattern is made by photolithography.

For example, the Non-Patent Publication 1 mentioned below describes the following steps as an example of photolithography.
(1) A step for coating a conductive ink containing metal nanowires onto a substrate
(2) A step for curing to form a transparent conductive layer
(3) A step for forming a photosensitive resist on the transparent conductive layer
(4) A step for applying optical energy, through a light-shielding mask corresponding to a fine pattern, to the resist
(5) A step for developing a latent image of the obtained resist, by elusion using an appropriate developer
(6) A step for removing an exposed patterned film (transparent conductive layer) using an appropriate etching method
(7) A step for removing the remaining resist by an appropriate method Further, Patent Publication 1 describes the following steps.
(1) A step for coating a conductive ink containing silver nanowires dispersed in water, onto a substrate
(2) A step for sintering to form a silver nanowire network layer.
(3) A step for forming a photo-curable matrix material containing a prepolymer, on the silver nanowire network layer
(4) A step for providing photon energy to the matrix material through an appropriate light-shielding mask corresponding to a fine pattern
(5) A step for removing a non-cured region by cleansing with a solvent (ethanol), or a step for physically removing the non-cured region using an adhesive tape or an adhesive roller

PRIOR ARTS

Patent Document

Patent Document 1: Japanese Unexamined Patent Publication (Kohyo) No. 2009-505358

Non-Patent Document

Non-Patent Document 1: Shih-Hsiang Lai, Chun-Yao Ou, Chia-Hao Tsai, Bor-Chuan Chuang, Ming-Ying Ma, and Shuo-Wei Liang; SID Symposium Digest of Technical Papers, Vol. 39, Issue 1, pp. 1200-1202 (2008)

SUMMARY

However, in either of the method disclosed in Non-Patent Document 1 and Patent Document 1, a step for forming a photosensitive layer for forming a pattern, on the layer having metal nanowires, is necessary. Further, since a step for developing the photosensitive layer is required, a step for disposing of developer waste may be required. In addition, after developing the photosensitive layer and removing the exposed metal nanowire containing layer, a step for removing the photosensitive layer may be required. Accordingly, the photolithography has drawbacks that a large number of steps are required, and many medical solutions are used.

One of the objectives of the present disclosure is to provide a conductive pattern manufacturing method and a conductive pattern formed substrate capable of preventing the pattern visibility, without making the pitch between the conductive region and the non-conductive region narrow as in the prior arts, by reducing the difference in optical properties between the conductive region and the non-conductive region.

In order to attain the above objective, one aspect of the present disclosure is a method for manufacturing a conductive pattern, the method comprising, a step for forming a metal nanowire layer containing metal nanowires, on the entirety or a part of at least one of the main faces of a substrate, and a step for irradiating light to the metal nanowire layer in a predetermined pattern to sinter the metal nanowires in the metal nanowire layer in a region of the predetermined pattern.

The metal nanowire layer may contain metal nanowires and a binder resin.

The light may be any light capable of sintering the metal nanowires, such as a pulsed light irradiated through a mask in which a light transmission portion having a shape of the pattern is formed, and the pulsed light is preferable.

The metal nanowires are preferably silver nanowires.

For the purpose of improving the adhesiveness to the substrate, an undercoat layer may be formed by undercoating the substrate, and thereafter, the metal nanowire layer may be formed on the undercoat layer.

The metal nanowire layer may be formed by coating a metal nanowire ink containing metal nanowires, a binder resin, and a dispersion medium, on the entirety or a part of at least one of the main faces of the substrate.

The metal nanowire layer may be formed by coating a metal nanowire ink which contains metal nanowires dispersed in a solvent capable of dissolving or swelling the material of the substrate, on the entirety or a part of at least one of the main faces of the substrate.

Another aspect of the present disclosure is a conductive pattern formed substrate comprising a substrate and a metal nanowire layer containing metal nanowires, the metal nanowire layer being provided on the entirety or a part of at least one of the main faces of the substrate, wherein, the metal nanowire layer comprises: a conductive region in which the metal nanowires are sintered in a predetermined pattern, and a non-conductive region which is a region other than the conductive region in the metal nanowire layer, and in which the metal nanowires are not sintered.

Preferably, the conductive region has a surface resistance of $200\Omega/\square$ or less, and the non-conductive region has a surface resistance of $10^3\Omega/\square$ or more.

Preferably, the metal nanowire has an average diameter of 1 nm or more and 500 nm or less, an average major axis length of 1 μm or more and 100 μm or less, and an aspect ratio of 10 or more.

According to the present disclosure, a narrow-pitched conductive pattern can be realized by simple steps.

BRIEF DESCRIPTION OF DRAWINGS

FIG. 1(a),(b),(c) are cross-sectional view explaining the steps of a conductive pattern manufacturing method according to the present aspect.

FIG. 2 is a view for explaining the definition of a pulsed light.

FIG. 3(a),(b),(c) are cross-sectional view explaining the steps of a modified example of a conductive pattern manufacturing method according to the present aspect.

FIG. 4 is a view showing an SEM image of a surface of a substrate (ZEONOR Sheet) after the metal nanowire layer is printed and dried, in Example 1.

FIG. 5 is a plan view showing the structure of a mask used in Examples 1 and 2.

FIG. 6(a),(b) are plan views showing structures of masks having apertures, which are used in Examples 3, 5, 7, and 8, or Examples 4 and 6, respectively.

ASPECT OF DISCLOSURE

Hereinbelow, an aspect of the present disclosure (hereinafter, referred to as an aspect) will be described, with reference to the drawings.

FIG. 1(a) to FIG. 1(c) show cross-sectional views explaining the steps of a conductive pattern manufacturing method according to the present aspect. A metal nanowire layer 12 is formed on the entirety or a part of at least one of the main faces of the substrate. The metal nanowire layer 12 formed on the substrate 10 has a substantially uniform metal nanowire concentration (distribution) within the plane. FIG. 1(a) shows an example that the metal nanowire layer 12 is formed on the entirety of one main face of the substrate 10. The method for forming the metal nanowire layer 12 will be explained later below.

Next, in FIG. 1(b), pulsed light is irradiated from a xenon pulsed light irradiation lamp, etc., to the metal nanowire layer 12 through a mask 14 with a light transmission portion 14a having a predetermined pattern. Thereby, in the metal nanowire layer 12, metal nanowires contained in the region to which the pulsed light has been irradiated are sintered in the predetermined pattern, and provided with conductivity. On the other hand, metal nanowires contained in the region to which the pulsed light has not been irradiated are not sintered, and are not provided with conductivity (conductivity is not exhibited). As a result, as shown in FIG. 1(c), the region 12c of the metal nanowire layer 12 which has been irradiated with the pulsed light defines a conductive region, and the region 12i of the metal nanowire layer 12 which has not been irradiated with the pulsed light defines a non-conductive region. Therefore, a conductive pattern similar to the pattern of the light transmission portion 14a of the mask 14, is formed.

The electric resistance of the conductive region can be appropriately determined in accordance with the purpose of use. For example, the surface resistance is preferably $200\Omega/\square$ or less. The surface resistance is the lower, the better, and the lower limit value cannot be defined. However, according to the manufacturing method of the present aspect, the surface resistance is, for example, approximately $100\Omega/\square$. The surface resistance of the non-conductive region can also be appropriately determined as far as the insulation property in accordance with the purpose of use can be ensured. The surface resistance is, for example, $10^3\Omega/\square$ or more, and preferably $10^6\Omega/\square$ or more.

The light transmission portion 14a may be a patterned aperture formed in the mask 14, or may be formed by applying an optically transparent material to a partial (patterned) region of the mask 14.

The mask used herein is formed by providing a pattern of a light-shielding material such as a metal, a black pigment, etc., on a substrate made of a material which is transparent from near-ultraviolet to near-infrared. This is generally referred to as a photomask. As for the substrate made of a transparent material, glass or synthesized quartz are often used, and a figure is drawn thereon as a light-shielding film, by chrome. Instead, a flexible transparent polymer film on which a figure is drawn may be used. This is referred to as an emulsion mask. The present disclosure is not limited to these, and as far as a light-shielding material is drawn on a transparent material, any other materials can be used.

The substrate 10 is not limited as far as the substrate is a sheet or a film, and may be made of, for example, glass, ceramics such as alumina etc., or a thermoplastic resin, a photo-curable resin, a thermosetting resin such as a polyester resin, a cellulose resin, a vinyl alcohol resin, a vinyl chloride resin, a cycloolefin resin, a polycarbonate resin, an acrylic resin, an ABS resin, etc. When a substrate is applied to a conductive film according to the present disclosure, if the transparency is considered important, a material having a total light transmittance of 80% or more is preferably used. Specifically, such a material may be glass, a polyester resin, a polycarbonate resin, an acrylic resin, a cellulose resin, etc.

The preferable thickness of the substrate 10 may vary depending on the use, but if the substrate is a sheet, the thickness is preferably 500 μm or more and 10 mm or less, and if the substrate is a film, the thickness is preferably 10 μm or more and 500 μm or less.

In the present specification, the "pulsed light" is a light having a short photoirradiation period (irradiation time). When a plurality of times of photoirradiation are repeated, as shown in FIG. 2, there is a period in which photoirradiation is not performed (irradiation interval (off)) between a first photoirradiation period (on) and a second photoirradiation period (on). In FIG. 2, the pulsed light is illustrated to have a constant light intensity, but the light intensity may vary within one photoirradiation period (on). The pulsed light is irradiated from a light source provided with a flash lamp such as a xenon flash lamp. Using such a light source, pulsed light is irradiated to metal nanowires deposited on the substrate. When irradiation is repeated for n-times, one cycle (on+off) in FIG. 2 is repeated for n-times. At the time of repeated irradiation, it is preferable to cool the substrate 10 side so that the substrate material can be cooled to a temperature near the room temperature when the next pulsed light irradiation is performed.

For the pulsed light, electromagnetic waves having a wavelength in the range from 1 pm to 1 m may be used, preferably, electromagnetic waves having a wavelength in the range from 10 nm to 1000 µm may be used (from far ultraviolet to far infrared), and more preferably, electromagnetic waves having a wavelength in the range from 100 nm to 2000 nm may be used. Examples of such electromagnetic waves may be gamma rays, X-rays, ultraviolet rays, visible rays, infrared rays, microwaves, radiowaves on the longer wavelength side of the microwaves, and the like. Considering transformation into thermal energy, too short wavelength is not preferable because a shape-holding material, a resin material used for pattern printing, etc., may be largely damaged. Also, too long wavelength is not preferable because efficient absorption cannot be performed, and as a result, exothermic heating cannot be performed. Accordingly, the wavelength range is preferably the range from the ultraviolet to infrared among the above-mentioned wavelengths, and more preferably, in the range from 100 to 2000 nm.

One irradiation period (on) of the pulsed light is preferably from 20 microseconds to 50 milliseconds, although the period may vary depending on the light intensity. If the period is less than 20 microseconds, sintering of the metal nanowires does not progress, resulting in providing a lower effect of increasing the performance of a conductive film. If the period is longer than 50 milliseconds, there may be bad influences on the substrate, due to photodegradation and thermal degradation, and further, nanowires may be easily blown away. More preferably, the irradiation period is from 40 microseconds to 10 milliseconds. Due to the reasons mentioned above, pulsed light instead of continuous light is used in the present aspect. A single shot of the pulsed light is effective, but the irradiation may be repeated as mentioned above. When the irradiation is repeated, the irradiation interval (off) is preferably in a range from 20 microseconds to 5 seconds, and more preferably in a range from 2 milliseconds to 2 seconds. If the irradiation interval is shorter than 20 microseconds, the pulsed light becomes similar to a continuous light and another irradiation is performed after one irradiation without leaving enough time for cooling. Thus, the substrate is heated to a very high temperature and may be deteriorated. The irradiation interval longer than 5 seconds is not preferable for mass production because the processing time becomes long.

FIG. 3(a) to FIG. 3(c) show cross-sectional views explaining steps of a modified example of the conductive pattern manufacturing method according to the present aspect. In FIG. 3(a) to FIG. 3(c), same numerals are assigned to the elements same as those in FIG. 1(a) to FIG. 1(c). FIG. 3(a) and FIG. 3(c) are the same as FIG. 1(a) and FIG. 3(c), respectively, and thus, the explanation therefor is omitted.

Unlike FIG. 1(b), in FIG. 3(b), laser light is used instead of the pulsed light. The laser light is generated from the laser light source 16, and is irradiated to the metal nanowire layer 12, while scanning is performed with the laser light in a predetermined pattern by a scanning means 18 such as a galvano scanner. Thereby, the metal nanowires contained in the region of the metal nanowire layer 12 to which the laser light has been irradiated are sintered, and the conductivity is applied thereto. As a result, as shown in FIG. 3(c), the region 12c of the metal nanowire layer 12 which has been irradiated with the laser light defines a conductive region, whereas the region 12i of the metal nanowire layer 12 which has not been irradiated with the laser light defines a non-conductive region. Thus, a conductive pattern having the predetermined pattern can be formed.

As for the laser light source 16, for example, LD pumping Q switched Green-YVO$_4$ laser KLY-QGS5α manufactured by Kataoka Coporation, etc., may be used.

The metal nanowire layer 12 is formed by depositing metal nanowires on the substrate surface to an extent that the light can sufficiently transmit through the gap between the nanowires. Namely, the metal nanowires are usually irregularly deposited, and are not densely deposited. Accordingly, by forming the conductive pattern with the metal nanowire layer 12, applying the conductive pattern to the electrode pattern of a touch panel, etc., becomes possible. Even if the metal nanowires are regularly arranged, as far as the light can sufficiently transmit through the gap between the nanowires, this can be also used as the metal nanowire layer 12 of the present disclosure.

The metal nanowire constituting the metal nanowire layer 12 is a metal having a diameter of the wire in the order of nanometer, and is a conductive material having a linear shape (including a hollow tube shape). The metal nanowire may be soft or rigid. The metal of the metal nanowires may contain a metal oxide in at least a part thereof.

The kind of the metal may be one selected from the group consisting of gold, silver, platinum, copper, nickel, iron, cobalt, zinc, ruthenium, rhodium, palladium, cadmium, osmium, and iridium, or an alloy etc., formed by combining some of these. In order to obtain a coating film having a low surface resistance and a high total light transmittance, containing at least one of gold, silver, and copper is preferable. These metals have a high conductivity, and thus, when a certain surface resistance should be obtained, the density of the metal within the surface may be reduced, and high total light transmittance can be achieved.

Among these metals, containing at least gold, copper or silver is preferable, in view of the conductivity. The most appropriate example may be silver.

The metal nanowires preferably show certain distributions regarding their diameter sizes, major axis lengths, and aspect ratios. The distributions are selected so that the coating film constituted by the metal nanowire layer 12 according to the present aspect of the disclosure has a high total light transmittance and a low surface resistance. Specifically, the metal nanowires have an average diameter size of preferably 1 nm or more and 500 nm or less, more preferably 5 nm or more and 200 nm less, still more preferably 5 nm or more and 100 nm or less, and particularly preferably 10 nm or more and 100 nm or less. The average major axis length of the metal nanowires is preferably 1 µm or more and 100 µm or less, more preferably 1 µm or more and 80 µm or less, still more preferably 2 µm or more and 60 µm or less, and particularly preferably 5 µm or more and 40 µm or less. While satisfying the above average diameter size and the average major axis length, the metal nanowires have an average aspect ratio of preferably 10 or more and 5000 or less, more preferably 100 or more and 2000 or less, and still more preferably 200 or more and 1000 or less. Here, the aspect ratio refers to a value obtained by a/b, wherein "b" represents an average diameter size of the metal nanowires and "a" represents an average major axis length thereof. The values "a" and "b" may be measured by a scanning electron microscope. By controlling the concentration of the metal nanowires in the metal nanowire layer 12 and maintaining the conductivity by the inter-locking of the wires, the transparent conductive pattern can be formed.

The metal nanowire layer 12 is formed on the entirety or a part of at least one main face of the substrate 10 by wet coating. Dry coating, for example, a vacuum vapor deposition method such as a physical vapor deposition method, a chemical vapor deposition method, etc., an ion plating method using a plasma generation technology, a sputtering method, or the like, is not used. In the present aspect, the wet coating means a process to form a film by coating a liquid (metal nanowire ink) on the substrate 10. The wet coating to be used in the present aspect is not limited and can be any known methods, and thus, spray coating, bar coating, roll coating, die coating, inkjet coating, screen coating, dip coating, relief printing, intaglio printing, gravure printing, and the like, can be used. Further, depending on the coating method and the conditions of the material, subsequent to the wet coating, a process to remove the coated material or the used solvent by heating the substrate 10, a process to wash away impurities such as a dispersion medium, etc., contained in the formed conductive layer, and the like, may be included.

Further, the wet coating may be performed not only once, but also repeatedly for a plurality of times. Under some coating conditions, if the wet coating is performed once, the film may not have a desired film thickness.

The dispersion medium to be used for the wet coating may be, for example, a ketone compound such as acetone, methyl ethyl ketone, methyl isobutyl ketone, cyclohexanone; an ester compound such as methyl acetate, ethyl acetate, butyl acetate, ethyl lactate, methoxyethyl acetate; an ether compound such as diethyl ether, ethylene glycol dimethyl ether, ethyl cellosolve, butyl cellosolve, phenyl cellosolve, dioxane; an aromatic compound such as toluene, xylene; an aliphatic compound such as pentane, hexane; a halogenated hydrocarbon such as methylene chloride, chlorobenzene, chloroform; an alcohol compound such as methanol, ethanol, n-propanol, isopropanol, 1-methoxy-2-propanol (PGME), ethylene glycol, diethylene glycol, triethylene glycol, dipropylene glycol, terpineol, glycerin, diglycerin, bornyl cyclohexanol, bornyl phenol, isobornyl cyclohexanol, isobornyl phenol; water; and a mixing solvent of any of above.

The metal nanowire ink according to the present aspect is produced by dispersing the metal nanowires in the above-mentioned dispersion medium. The metal nanowire ink contains metal nanowires and a dispersion medium, and the metal nanowire content in the metal nanowire ink is preferably 0.01 to 10% by mass, more preferably 0.05 to 5% by mass, and still more preferably 0.1 to 3% by mass. If the metal nanowire content is less than 0.01% by mass, the transparent conductive film layer should be printed very thick in order to obtain a desired conductivity, leading to increasing the difficulty in printing, and increasing the difficulty in maintaining the pattern at the time of drying. If the metal nanowire content exceeds 10% by mass, the printing should be performed very thin in order to obtain a desired transparency, leading to increasing the difficulty in printing.

The dispersion medium contained in the coated film after the coating process is removed by an appropriate method. For example, the dispersion medium may be removed by heating (drying) using a heating furnace, far-infrared furnace, etc. A vacuum drying method may be applied thereto.

The metal nanowire layer 12 may be formed by a metal nanowire ink having components other than the metal nanowires, within the range that the effect of the present disclosure is not damaged. Specifically, such a component may be a binder resin, a surfactant, a pigment, etc.

The mixing ratio between the metal nanowires and other components such as a binder may be changed depending on the use. However, if the mixing ratio of the metal nanowires is too small, there may be a risk that the conductivity decreases. Thus, the ratio by mass of the metal nanowires in the metal nanowire layer 12 is preferably 10% by mass or more and 100% by mass or less, more preferably 30% by mass or more and 60% by mass or less. Here, the ratio of the binder includes the eluate of the substrate 10. Here, the "metal nanowire layer" is a layer formed on the substrate by wet coating, from which the dispersion medium of the metal nanowire ink has been removed.

When the metal nanowire layer 12 is printed over the entirety or on a part of the surface of the substrate 10, an undercoat layer may be formed before the printing, the undercoat layer contributing in increasing the adhesion property between the substrate and the metal nanowires. The metal nanowire layer 12 may be formed on the undercoat layer by wet coating. As for the undercoat layer, for example, a soft resin which allows a part of the metal nanowire to dig thereinto, or a resin which is dissolved or swollen in a solvent (dispersion medium) used for the wet coating and allows a part of the metal nanowire to dig thereinto during printing. Since a part of the metal nanowire can dig into the undercoat layer, the adhesion between the substrate 10 and the metal nanowire layer 12 can be increased.

The undercoat resin used herein should be optically transparent, should become almost tack-free (non-adhesive) after the solvent is dried (to an extent that at least screen printing or gravure offset printing can be performed thereto), should be certainly adhesive to the metal nanowires such as Ag nanowire and the like by photoirradiation. In the present specification, "optically transparent" refers to having a total light transmittance of 80% or more and a haze of 10% or less.

When a transparent resin which can be softened by absorbing the heat generated at the time of photoirradiation, is used for the undercoat layer, adhesiveness to the metal nanowires such as Ag nanowires, etc., can be certainly obtained by photoirradiation. Therefore, the resin may be an amorphous thermoplastic resin having a Tg (glass transition temperature) of 200° C. or less, or a curable resin which has Tg of 200° C. or less, and which becomes to have a three-dimensional cross-linked structure by performing photoirradiation to a curable resin prepolymer which does not have the three-dimensional cross-linked structure before the photosintering. The Tg is preferably 160° C. or less, and more preferably 130° C. or less. Even if the Tg is 200° C. or less, when a curably resin which already has the three-dimensional cross-linked structure before the photoirradiation is used, softening does not sufficiently occur at the time of photosintering, and sufficient adhesiveness to the metal nanowires such as Ag nanowires cannot be obtained. On the other hand, when a tack-free material is used, there is no specific lower limit value of Tg. However, the Tg is preferably −50° C. or more, and more preferably 0° C. or more. Still more preferably, the material is a curable resin prepolymer which is almost tack-free and has a Tg of 200° C. or less, before the photoirradiation, and which, after being cured by photoirradiation, has a Tg of 200° C. or more and has an increased solvent resistance. Here, the prepolymer refers to a curable resin precursor (composition) which becomes to have a three-dimensional cross-linked structure by heat or light. Examples of such a prepolymer may be a diallyl phthalate (DAP) prepolymer, an urethane acrylate prepolymer, and the like.

Specific examples of the thermoplastic resin may be a cyclic polyolefin resin (cycloolefin copolymer (COC), cycloolefin polymer (COP)), a polycarbonate resin, an epoxy resin (phenoxy type), a polyvinyl butylal resin, an ethylene-vinylacetate copolymer resin, an ethylene vinylalcohol copolymer resin, an acrylic resin, and the like.

For the purpose of ensuring the insulation property before the irradiation of the pulsed light or the laser light, and the insulation property of the non-irradiated portion after the irradiation step, forming the metal nanowire layer 12 with a metal nanowire ink containing a binder resin is desired. The binder resin may be a thermoplastic resin or a thermoset resin, which is, for example, a poly-N-vinyl compound such as poly-N-vinylpyrrolidone, poly-N-vinyl caprolactam, and poly-N-vinylacetamide, a polyalkylene glycol compound such as polyethyleneglycol, polypropyleneglycol, and poly THF, polyurethane, a cellulose compound and a derivative thereof, a phenoxy type epoxy compound, a polycarbonate compound such as Iupizeta (registered trademark) manufactured by Mitsubishi Gas Chemical Company, Inc., a polyester compound, chlorinated polyolefin, a cycloolefin polymer, copolymer such as ZEONOR (manufactured by Zeon corporation), APEL (manufactured by Mitsui Chemicals, Inc.), and a polyacrylic compound such as polymethylmethacrylate.

Instead of using the binder resin, a solvent capable of dissolving or swelling the substrate 10 may be used as a dispersion medium, and the metal nanowire layer 12 may be formed with a metal nanowire ink having metal nanowires dispersed therein, while dissolving the surface of the substrate 10 during printing. In this case, a part of the metal nanowire may be able to dig into the substrate 10.

Specifically, when the substrate 10 is made of a cycloolefin polymer or a cycloolefin copolymer such as ZEONOR, the dispersion medium may be an aromatic hydrocarbon compound such as toluene, xylene, an alicyclic hydrocarbon such as cyclohexane, or a terpene alcohol such as terpineol, isobornyl cyclohexanol. When the substrate 10 is made of polycarbonate, the dispersion medium to be mixed in the metal nanowire ink may be a halogenated hydrocarbon such as dichloromethane, chloroform.

When the metal nanowire ink containing the binder resin is printed on the surface of the substrate 10, the undercoat layer may be or may not be formed on the substrate 10.

The metal nanowire layer 12 described above may not be a metal nanowire resin layer shown in FIG. 1(a) to FIG. 1(c) and FIG. 3(a) to FIG. 3(c), but may be a resin coating around the metal nanowires. However, using too small amount of resin for coating may cause a problem such that the portion which should be insulated has conductivity when some pressure is applied to the metal nanowire layer 12.

EXAMPLES

Hereinafter, specific examples of the present disclosure will be explained. The examples are described below for the purpose of easy understanding of the present disclosure, and the present disclosure is not limited to these examples.

Example 1

<Method for Preparing Ink which does not Containing Binder>

SLV-NW-35 (isopropanol dispersion liquid, silver nanowire having a diameter of 35 nm and a length of approximately 15 μm (catalog value), manufactured by Blue Nano, Inc.) was used as a silver nanowire dispersion liquid. A small amount of terpineol (manufactured by Nippon Terpene Chemicals Inc.) was added to this silver nanowire dispersion liquid, and dispersed well. Thereafter, isopropanol was distilled away, and solvent displacement was performed. Then, Tersorb MTPH (isobornyl cyclohexanol, manufactured by Nippon Terpene Chemicals, Inc.) and terpineol were added so that the final concentration of the dispersion medium became terpineol/Tersorb MTPH=1/8 (mass ratio), and were dispersed well using ARV-310 manufactured by Thinky Corporation to thereby obtain dispersion liquid. The small amount of terpineol which was added first was predetermined by calculation so that the concentration of the finally obtained dispersion liquid has a silver nanowire concentration of 1% by mass.

Using the above-mentioned dispersion liquid (ink), a 11-cm-square metal nanowire layer 12 was printed on a ZEONOR sheet ZF14-100 (thickness: 100 μm, manufactured by Zeon Corporation), by a screen printer MT-320 TVZ (manufactured by Microtek Inc.), which was subjected to drying for 90 minutes under the conditions of 60° C.-30 minutes, 80° C.-30 minutes, and 100° C.-30 minutes. FIG. 4 shows an SEM image of the surface of the substrate (ZEONOR sheet) after being printed and dried. In view of the image, the situation that a part of the silver nanowire is buried in the substrate, the surface of the substrate being dissolved or swollen by terpineol and Tersorb MTPH, can be observed.

The surface resistance of the conductive region before the photoirradiation was measured by a four-point probe method using a linear four-point probe (distance between electrodes: 1.5 mm) of a low resistivity meter (LORESTA-GP, manufactured by Mitsubishi Chemical Analytech Co., Ltd.). The results are shown in Table 1.

Next, a mask 14 provided with a light transmission portion 14a in a pattern shown in FIG. 5 was prepared and aligned with the above-mentioned 11-cm-square film, which was subjected to pulsed light irradiation (irradiation energy: 2.0 J/cm$^2$) performed at an irradiation voltage of 600 V, for an irradiation time of 80 μsec, using Pulse Forge 3300 manufactured by NovaCentrix. The mask 14 has a pattern in which 2-cm-width light transmission portions 14a and 0.5-cm-width light non-transmission portions are alternately formed from the left end of FIG. 5. The light transmission portion 14a at the right end of FIG. 5 has a width of 0.5 cm.

After the photoirradiation, the resistance (resistance within the conductive region) of the film was measured by placing the measurement probes at the opposite ends of the metal nanowire layer corresponding to the light transmission portion (conductive region), using DIJITAL MULTIMETER PC500a (manufactured by Sanwa Electric Instrument Co., Ltd.). As a result, all of the four 2-cm-width lines had a resistance of 50Ω. Further, the resistance (resistance between the conductive regions) was measured by placing the measurement probes at the two conductive regions adjacent to a non-conductive region in the metal nanowire layer 12, corresponding to the light non-transmission portion of the mask. The resulting resistance value was out of the measurable range, confirming that the insulation was maintained. Subsequently, each of the two conductive regions of the obtained sintered pattern was clipped by an alligator clip, and was connected in series to an electric power source KEITHLEY 2400 Source Meter (manufactured by KEITHLEY Instruments, Inc.), and an ammeter KEITHLEY 2110 5 1/2 DIGIT MULTIMETER (manufactured by KEITHLEY Instruments, Inc.). Thereafter, a voltage was continuously applied for one hour, and the maximum voltage (one-hour withstand voltage) at which the insulation can be maintained (the current value was maintained at 10 µA or lower) was measured. The evaluation results are shown in Table 1.

The metal nanowire layer 12 after being subjected to the photoirradiation was visually observed. As a result, no difference could be observed between the conductive region and the non-conductive region with the naked eye.

Example 2

An ink was prepared by adding poly-N-vinylpyrrolidone (hereinbelow, referred to as PNVP, K-90, molecular weight: 360,000, manufactured by Nippon Shokubai Co., Ltd.) to the ink produced in Example 1, so that the resulting ink containing 0.5 parts by mass of poly-N-vinylpyrrolidone relative to the 99.5 parts by mass of silver nanowire. Using the thus produced ink, an 11-cm-square metal nanowire layer 12 was printed on LUMIRROR (registered trademark) (biaxially oriented polyester film, thickness: 125 µm, manufactured by Toray Industries, Inc.), by a screen printer MT-320 TVZ (manufactured by Microtek Inc.). The thickness of the metal nanowire layer 12 after being dried was 0.15 µm.

Next, a mask 14 provided with a light transmission portion 14a in a pattern shown in FIG. 5 was prepared and aligned with the above-mentioned 11-cm-square metal nanowire layer 12, which was subjected to pulsed light irradiation (irradiation energy: 1.0 J/cm$^2$) performed at an irradiation voltage of 600 V, for an irradiation time of 50 µsec, using Pulse Forge 3300 manufactured by NovaCentrix. The mask 14 has a pattern in which 2-cm-width light transmission portions 14a and 0.5-cm-width light non-transmission portions are alternately formed from the left end of FIG. 5. The light transmission portion 14a at the right end of FIG. 5 has a width of 0.5 cm.

Similar to Example 1, the surface resistance of the conductive region before the photoirradiation was measured by the four-point probe method using a four-point linear probe (distance between electrodes: 1.5 mm) of a low resistivity meter (LORESTA-GP, manufactured by Mitsubishi Chemical Analytech Co., Ltd.). The results are shown in Table 1.

After the photoirradiation, similar to Example 1, the resistance (resistance within the conductive region) of the film was measured by placing the measurement probes at the opposite ends of the metal nanowire layer corresponding to the light transmission portion of the mask (conductive region), using DIJITAL MULTIMETER PC500a (manufactured by Sanwa Electric Instrument Co., Ltd.). As a result, all of the four 2-cm-width lines had a resistance of 50Ω. Further, similar to Example 1, the resistance (resistance between the conductive regions) was measured by placing the measurement probes at the two conductive regions adjacent to a non-conductive region in the metal nanowire layer 12, corresponding to the light non-transmission portion of the mask, to thereby confirm that the insulation was maintained. Subsequently, similar to Example 1, the one-hour withstand voltage was measured. The evaluation results are shown in Table 1.

The metal nanowire layer 12 after being subjected to the photoirradiation was visually observed. As a result, no difference could be observed between the conductive region and the non-conductive region with the naked eye.

TABLE 1

| EXAMPLES | Metal Nanowire Content (% by mass) | Resin | Substrate | Light Shielding Line Width (mm) | Surface Resistance within conductive region before photoirradiation (Ω/□) | Photosintering Conditions | Surface Resistance within conductive region after photoirradation (Ω) | One-Hour Withstand Voltage (V) |
|---|---|---|---|---|---|---|---|---|
| EXAMPLE 1 | 100 | None | ZEONOR | 5 | >10$^8$ | Pulsed Light 600 V-80 µs (2.0 J/cm$^2$) | 50 | 105 |
| EXAMPLE 2 | 99.5 | PNVP | PET (LUMIRROR U98) | 5 | >10$^8$ | Pulsed Light 600 V-50 µs (1.0 J/cm$^2$) | 50 | 92 |

Example 3

<Preparation of Ink Containing Binder Resin, and Property Evaluation>

1 g of poly-N-vinylpyrrolidone (hereinbelow, referred to as PNVP, K-90, molecular weight: 360,000, manufactured by Nippon Shokubai Co., Ltd.) as a binder resin was dissolved in 9 g of terpineol to prepare a PNVP 10% by mass terpineol solution. 250 mg of a silver nanowire 2% by mass terpineol dispersion liquid, the silver nanowire dispersion liquid being prepared by solvent displacement as in Example 1 while the quantitative ratios were changed, 350 mg of terpineol, and 1 g of methyl isobutyl ketone (hereinbelow, referred to as MIBK, manufactured by Tokyo Chemical Industry, Co., Ltd.) were added to 400 mg of this PNVP terpineol solution. The resulting solution was subjected to shaking and stirring for one minute at a room temperature of 25° C., by VORTEX3, a new vortex shaker suitable for short-time operation (manufactured by IKA Corp.). Thereby, an ink was prepared.

The ink prepared by the above method was coated on a substrate made of a 100-µm-thick PET film (KFL10W, manufactured by Teijin DuPont Films Japan Limited, or SHB100, manufactured by Toray Industries, Inc.), using a spiral applicator for 10 µm thickness (manufactured by TQC B.V.), which was then, heated and dried under air at 100° C. for one hour, by a constant temperature chamber HS350

(manufactured by ETAC (Kusumoto Chemicals, Ltd.)), to thereby form a metal (silver) nanowire layer. After being dried, the layer has a film thickness of 300 nm.

A mask (made of stainless steel, thickness: 300 μm, refer to FIG. 6(a)) provided with two 25-mm-square apertures separated by a light shielding line having a width of 1 mm, was arranged on the PET film on which the obtained metal (silver) nanowire layer was formed, which was subjected to a single shot of pulsed light irradiation (irradiation energy: 1.0 J/cm$^2$) performed at an irradiation voltage of 600 V, for an irradiation time of 50 μsec, using Pulse Forge 3300 (manufactured by NovaCentrix). Accordingly, a conductive pattern was obtained.

With respect to electrical properties, the surface resistance within the conductive region, before the photoirradiation, was measured by a high resistivity meter (Hiresta-UP MCP-HT450, manufactured by Mitsubishi Chemical Corporation) (measurement probe (UR100)), whereas the surface resistance within the conductive region after the photoirradiation was measured by a four-point probe method using a four-point linear probe (distance between electrodes: 1.5 mm) of a low resistivity meter (LORESTA-GP, manufactured by Mitsubishi Chemical Analytech Co., Ltd.). Before the photoirradiation, the surface resistance within the conductive region exceeded the measurable limit, whereas, after the photoirradiation, the surface resistance within the conductive region was 100 to 150Ω/□. The resistance between the conductive regions was measured by DIJITAL MULTIMETER PC500a (manufactured by Sanwa Electric Instrument Co., Ltd.). The resistance between the conductive regions exceeded the upper limit of the measurable range, and thus, the insulation was maintained.

Further, similar to Example 1, the one-hour withstand voltage was measured. The results are shown in Table 2.

Example 4

<Preparation of Ink Containing Binder Resin, and Property Evaluation>

Preparation of an ink containing a binder resin, and property evaluation therefor, were performed under the conditions that the light shielding line of the mask used for photosintering was 0.5 mm (FIG. 6(b)), and others were the same as the method in Example 3. The evaluation results are shown in Table 2.

Example 5

<Preparation of Ink Containing Binder Resin, and Property Evaluation>

1 g of poly-N-vinylacetamide (hereinbelow, referred to as PNVA, GE191-104P, molecular weight: 300,000, manufactured by Showa Denko K.K.) as a binder resin was dissolved in 9 g of 1-methoxy-2-propanol (hereinbelow, referred to as PGME, manufactured by Tokyo Chemical Industry, Co., Ltd.) to prepare a PNVA 10% by mass PGME solution to be used. 500 mg of a silver nanowire 1% by mass PGME dispersion liquid, the silver nanowire dispersion liquid being prepared by solvent displacement as in Example 1 while the dispersion solvent was changed, 300 mg of PGME, and 800 mg of MIBK were added to 400 mg of this PNVP PGME solution. The resulting solution was subjected to shaking and stirring for one minute, by VORTEX3 (manufactured by IKA Corp.). Thereby, an ink was prepared.

The obtained ink was evaluated in the same manner as in Example 3, except that the irradiation time was changed to 100 μsec (irradiation energy: 2.7 J/cm$^2$). The evaluation results are shown in Table 2.

Example 6

<Preparation of Ink Containing Binder Resin, and Property Evaluation>

Preparation of an ink containing a binder resin, and property evaluation therefor, were performed under the conditions that the light shielding line of the mask used for photosintering was 0.5 mm (FIG. 6(b)), and others were the same as the method of Example 5. The evaluation results are shown in Table 2.

Example 7

<Preparation of Ink Containing Binder Resin, and Property Evaluation>

1 g of polymethylmethacrylate (hereinbelow, referred to as PMMA, VH-001, manufactured by Mitsubishi Rayon Co., Ltd.) as a binder resin was dissolved in 9 g of MIBK to prepare a PMMA 10% by mass MIBK solution to be used. 250 mg of a silver nanowire 2% by mass terpineol dispersion liquid, 750 mg of terpineol, and 200 mg of MIBK, were added to 800 mg of this PMMA MIBK solution. The resulting solution was subjected to shaking and stirring for one minute, by VORTEX3 (manufactured by IKA Corp.). Thereby, an ink was prepared.

Using the obtained ink, evaluation was performed in the same manner as Example 3, except that the irradiation time was changed to 60 μsec (irradiation energy: 1.3 J/cm$^2$), and the substrate was changed to a 100-μm-thick PET film (TUFTOP SHB100, manufactured by Toray Industries, Inc.). The evaluation results are shown in Table 2.

Example 8

<Example Using Undercoat>

As an undercoat resin, a 20% by mass solution (solvent: butyl carbitol acetate) of a phenoxy type epoxy resin (jER1256, manufactured by Mitsubishi Chemical Corporation) was prepared. The obtained undercoat resin was coated on the surface of a substrate, i.e., LUMIRROR (registered trademark) T60 (polyester film, thickness: 125 μm, manufactured by Toray Industries, Inc.), which is thereafter subjected to drying at 80° C. for 60 minutes, to form an undercoat layer (film thickness: approximately 2 μm). Except that the polyester film provided with the undercoat layer was used, the evaluation was performed in the same manner as in Example 3. The evaluation results are shown in Table 2.

TABLE 2

| EXAMPLES | Metal Nanowire Content (% by mass) | Resin | Substrate | Light Shielding Line Width (mm) | Surface Resistance within conductive region before photoirradation ($\Omega/\square$) | Photosintering Conditions | Surface Resistance within conductive region after photoirradation ($\Omega/\square$) | One-Hour Withstand Voltage (V) |
|---|---|---|---|---|---|---|---|---|
| EXAMPLE 3 | 11 | PNVP | PET (KFL10W) | 1 | $>10^{13}$ | Pulsed Light 600 V-50 μs (1.0 J/cm$^2$) | 150 | 20 |
| EXAMPLE 4 | 11 | PNVP | PET (KFL10W) | 0.5 | $>10^{13}$ | Pulsed Light 600 V-50 μs (1.0 J/cm$^2$) | 150 | 10 |
| EXAMPLE 5 | 11 | PNVA | PET (KFL10W) | 1 | $>10^{13}$ | Pulsed Light 600 V-100 μs (2.7 J/cm$^2$) | 110 | 20 |
| EXAMPLE 6 | 11 | PNVA | PET (KFL10W) | 0.5 | $>10^{13}$ | Pulsed Light 600 V-100 μs (2.7 J/cm$^2$) | 110 | 10 |
| EXAMPLE 7 | 5.9 | PMMA | PET (TUFTOP SHB100) | 1 | $>10^{13}$ | Pulsed Light 600 V-60 μs (1.3 J/cm$^2$) | 150 | 9 |
| EXAMPLE 8 | 11 | PNVP | Undercoat PET (LUMIRROR T60) | 1 | $>10^{13}$ | Pulsed Light 600 V-50 μs (1.0 J/cm$^2$) | 140 | 19 |

Table 2 reveals that, in any of the cases where PNVP, PNVA, or PMMA are used, the surface resistances of the photoirradiated portion (exposed portion) were sufficiently decreased, and the insulation (one-hour withstand voltage) between the photoirradiated portion and non-photoirradiated portion were maintained.

The present disclosure can be applied to the formation of a transparent electrode to be used for a touch panel, etc.

EXPLANATION ON NUMERALS substrate 10, metal nanowire layer 12, conductive region 12c, non-conductive region 12i, mask 14, light transmission portion 14a, 16 laser light source, 18 scanning means.

The invention claimed is:

1. A method for manufacturing a transparent conductive pattern, the method comprising,
    a step for forming a metal nanowire layer by coating a metal nanowire ink on the entirety or a part of at least one of the main surfaces of a substrate, the metal nanowire ink containing metal nanowires dispersed in a dispersion medium in which a binder resin is dissolved, and
    a step for irradiating light to the metal nanowire layer in a predetermined pattern to sinter the metal nanowires in the metal nanowire layer in a region of the predetermined pattern for applying conductivity, and to form a sintered conductive region and an unsintered non-conductive region;
    wherein, the metal nanowires in the conductive region and non-conductive region have an average aspect ratio of 10 or more, an average diameter size of 5 nm or more and 100 nm or less, and an average major length of 1 μm or more and 60 μm or less.

2. The method for manufacturing a transparent conductive pattern according to claim 1, wherein the light is a pulsed light irradiated through a mask in which a light transmission portion having a shape of said pattern is formed.

3. The method for manufacturing a transparent conductive pattern according to claim 1, wherein the metal nanowires are silver nanowires.

4. The method for manufacturing a transparent conductive pattern according to claim 1, wherein an undercoat layer is formed by undercoating the substrate, and thereafter, the metal nanowire layer is formed on the undercoat layer.

5. The method for manufacturing a transparent conductive pattern according to claim 1, wherein the amount of metal nanowires in the metal nanowire layer is from 5.9 mass % to 99.5 mass %.

6. The method for manufacturing a transparent conductive pattern according to claim 5, wherein the amount of metal nanowires in the metal nanowire layer is from 10 to 60 mass %.

7. The transparent conductive pattern formed substrate according to claim 1, wherein the metal nanowires have an average major axis length of 5 μm or more and 40 μm or less, and an average diameter of not more than 35 nm.

8. The method for manufacturing a transparent conductive pattern according to claim 1, wherein the binder resin is a thermoplastic resin.

9. The method for manufacturing a transparent conductive pattern according to claim 8, wherein the thermoplastic resin is a poly-N-vinyl compound or a polyalkylene glycol compound.

10. A method for manufacturing a transparent conductive pattern, the method comprising,
    a step for forming a metal nanowire layer containing metal nanowires, on the entirety or a part of at least one of the main faces of a substrate,
    a step for irradiating light to the metal nanowire layer in a predetermined pattern to sinter the metal nanowires in the metal nanowire layer in a region of the predetermined pattern for applying conductivity, and to form a sintered conductive region and an unsintered non-conductive region,
    wherein the metal nanowire layer is formed by coating a metal nanowire ink which contains metal nanowires dispersed in a solvent capable of dissolving or swelling the material of the substrate, on the entirety or a part of at least one of the main faces of the substrate; and
    by applying metal nanowire ink on the entirety or a part of at least one of the main faces of the substrate, the substrate surface is dissolved or swollen, and the metal nanowire is buried in the substrate, and wherein the metal nanowires in the conductive region and non-conductive region have an average diameter size of 5 nm or more and 100 nm or less and an average major length of 1 μm or more and 60 μm or less.

11. The method for manufacturing a transparent conductive pattern according to claim 10, wherein the metal nanowire layer comprises a binder.

12. The method for manufacturing a transparent conductive pattern according to claim 10, wherein the light is a pulsed light irradiated through a mask in which a light transmission portion having a shape of said pattern is formed.

13. The method for manufacturing a transparent conductive pattern according to claim 10, wherein the metal nanowires are silver nanowires.

14. The method for manufacturing a transparent conductive pattern according to claim 10, wherein an undercoat layer is formed by undercoating the substrate, and thereafter, the metal nanowire layer is formed on the undercoat layer.

15. The method for manufacturing a transparent conductive pattern according to claim 10, wherein the metal nanowire layer is formed by coating a metal nanowire ink containing metal nanowires, a binder resin, and a dispersion medium, on the entirety or a part of at least one of the main faces of the substrate.

16. The method for manufacturing a transparent conductive pattern according to claim 10, wherein the amount of metal nanowires in the metal nanowire layer is from 5.9 mass % to 99.5 mass %.

17. The method for manufacturing a transparent conductive pattern according to claim 16, wherein the amount of metal nanowires in the metal nanowire layer is from 10 to 60 mass %.

18. The transparent conductive pattern formed substrate according to claim 10, wherein the metal nanowires have an average major axis length of 5 μm or more and 40 μm or less, and an average diameter of not more than 35 nm.

19. A transparent conductive pattern formed substrate comprising a substrate and a metal nanowire layer containing metal nanowires and a binder resin, the metal nanowire layer being provided on the entirety or a part of at least one of the main faces of the substrate, wherein, the metal nanowire layer comprises:
a conductive region in which the metal nanowires are sintered in a predetermined pattern, and
a non-conductive region which is a region other than the conductive region in the metal nanowire layer, and in which the metal nanowires are not sintered;

wherein the metal nanowires have an average aspect ratio of 10 or more, and the metal nanowires in the conductive region and non-conductive region have an average diameter size of 5 nm or more and 100 nm or less and an average major length of 1 μm or more and 60 μm or less.

20. The transparent conductive pattern formed substrate according to claim 19, wherein the conductive region has a surface resistance of 200Ω/□ or less, and the non-conductive region has a surface resistance of $10^3$Ω/□ or more.

21. The transparent conductive pattern formed substrate according to claim 20, wherein the non-conductive region has a surface resistance of $10^8$Ω/□ or more.

22. The transparent conductive pattern formed substrate according to claim 19, wherein the metal nanowires have an average major axis length of 5 μm or more and 40 μm or less, and an average diameter of not more than 35 nm.

23. The transparent conductive pattern formed substrate according to claim 19, wherein the binder resin is a thermoplastic resin.

24. The transparent conductive pattern formed substrate according to claim 23, wherein the thermoplastic resin is a poly-N-vinyl compound or a polyalkylene glycol compound.

25. The transparent conductive pattern formed substrate according to claim 20, wherein the binder resin is a thermoplastic resin.

26. The transparent conductive pattern formed substrate according to claim 25, wherein the thermoplastic resin is a poly-N-vinyl compound or a polyalkylene glycol compound.

27. The transparent conductive pattern formed substrate according to claim 19, wherein the amount of metal nanowires in the metal nanowire layer is from 5.9 mass % to 99.5 mass %.

28. The transparent conductive pattern formed substrate according to claim 19, wherein the amount of metal nanowires in the metal nanowire layer is from 10 to 60 mass %.

* * * * *